US010951034B2

(12) United States Patent
Leon Garcia et al.

(10) Patent No.: US 10,951,034 B2
(45) Date of Patent: Mar. 16, 2021

(54) PROTECTION FOR AN HVDC NETWORK

(71) Applicants: Supergrid Institute, Villeurbanne (FR); Institut Polytechnique De Grenoble, Grenoble (FR); Université Grenoble Alpes, Saint Martin d'heres (FR)

(72) Inventors: William Leon Garcia, Lyons (FR); Alberto Bertinato, Lyons (FR); Bertrand Raison, Lyons (FR); Pascal Tixador, Lyons (FR); Bruno Luscan, Lyons (FR)

(73) Assignees: Supergrid Institute, Villeurbanne (FR); Institut Polytechnique De Grenoble, Grenoble (FR); Universite Grenoble Alpes, Saint Martin d'Heres (FR)

( * ) Notice: Subject to any disclaimer, the term of this patent is extended or adjusted under 35 U.S.C. 154(b) by 127 days.

(21) Appl. No.: 16/332,599

(22) PCT Filed: Sep. 11, 2017

(86) PCT No.: PCT/FR2017/052407
§ 371 (c)(1),
(2) Date: Mar. 12, 2019

(87) PCT Pub. No.: WO2018/050997
PCT Pub. Date: Mar. 22, 2018

(65) Prior Publication Data
US 2020/0136389 A1    Apr. 30, 2020

(30) Foreign Application Priority Data

Sep. 14, 2016  (FR) .................................... 1658595

(51) Int. Cl.
*H02J 3/36*  (2006.01)
*H01H 33/59*  (2006.01)
(Continued)

(52) U.S. Cl.
CPC ............. *H02J 3/36* (2013.01); *H01H 33/596* (2013.01); *H01L 39/16* (2013.01); *H02H 7/268* (2013.01); *H02H 7/28* (2013.01); *H02H 9/023* (2013.01)

(58) Field of Classification Search
CPC ......... H02J 3/36; H01H 33/596; H01L 39/16; H02H 7/268; H02H 7/28; H02H 9/023
(Continued)

(56) References Cited

U.S. PATENT DOCUMENTS 5,631,795 A * 5/1997 Koyama ................ H02H 3/042
361/68
8,160,511 B2 * 4/2012 Uejima .................... H04B 1/44
455/83
(Continued)

FOREIGN PATENT DOCUMENTS

JP      2000294068 A    10/2000

OTHER PUBLICATIONS

Descloux et al., "Protection System for meshed HVDC network using superconducting fault current limiters", Grenoble Universite, 2013.

*Primary Examiner* — Yemane Mehari
(74) *Attorney, Agent, or Firm* — Gable Gotwals

(57) ABSTRACT

A method of protecting a high-voltage network comprising the steps for maintaining first controlled switches closed and second controlled switches open; measuring voltage and current on high-voltage interfaces; communicating the direction of the current to the other end of a high-voltage line; for each node: identifying a fault; verifying that the current is lower than the current interruption capability of the high-voltage interface switch and opening this switch.

13 Claims, 2 Drawing Sheets

(51) Int. Cl.
   *H01L 39/16* (2006.01)
   *H02H 7/26* (2006.01)
   *H02H 7/28* (2006.01)
   *H02H 9/02* (2006.01)
(58) Field of Classification Search
   USPC .............................................. 361/19; 363/51
   See application file for complete search history.

(56) References Cited

U.S. PATENT DOCUMENTS

2007/0139832 A1   6/2007  Lee et al.
2019/0074685 A1*  3/2019  Leon Garcia ............. H02J 3/36

\* cited by examiner

PROTECTION FOR AN HVDC NETWORK

CROSS-REFERENCE TO RELATED APPLICATIONS

This application is the United States National Phase of PCT Patent Application No. PCT/FR2017/052407 filed on 11 Sep. 2017, which claims priority to French Patent Application No. 1658595 filed 14 Sep. 2016, both of which are incorporated herein by reference.

The invention relates to high-voltage direct current, generally denoted by the acronym HVDC, transmission and/or distribution networks. The invention relates, in particular, to the selectivity and the continuity of service for an HVDC network when a fault occurs.

HVDC networks are notably envisaged as a solution to the interconnection of disparate or non-synchronous electricity production sites which are springing up with the development of renewable energies. HVDC networks, rather than AC technologies, are notably envisaged for the transmission and the distribution of energy produced by offshore wind farms, owing to the lower line losses and the absence of incidence of stray capacitances of the network over long distances. Such networks typically have voltage levels of the order of 50 kV or more.

For the point-to-point transmission of electricity, a sectioning may be carried out by means of an end-of-line converter, equipped with a circuit breaker on the AC side. On the other hand, the sectioning can no longer be implemented by such a converter in multipoint or multi-node transmission. The interruption of the DC current in such networks is a crucial issue directly conditioning the feasibility and the development of such networks. Indeed, the occurrence of a short-circuit at a node propagates very rapidly throughout the whole network. In the absence of a fast enough current interruption within the node, the short-circuit current continues to increase and may reach several tens of kA in a few ms. The short-circuit current may then exceed the current interruption capability of the DC circuit breakers of the various nodes. The short-circuit current could also damage the power electronics used in the AC/DC converters within the nodes of the network.

The known strategies for protection of such networks are based on the use of ultra-fast DC circuit breakers. Such circuit breakers prove to be both extremely costly and technologically complicated. Furthermore, such strategies are based on ultra-fast identification algorithms and relays not yet available on the market.

The invention aims to overcome one or more of these drawbacks. The invention is notably aimed at optimizing the selectivity and the continuity of service of the high-voltage network in the case of a fault, using electrical equipment at a reasonable cost. The invention thus relates to a method of protecting a high-voltage DC electrical network, such as defined in the appended claim 1.

The following various features may also be combined with the features of the dependent claims, where each of these features may be combined with the features of claim 1 without establishing an intermediate generalization.

The invention also relates to a high-voltage DC electrical network, such as defined in the appended claims.

Other features and advantages of the invention will become clearly apparent from the description of it presented hereinafter, by way of non-limiting example, with reference to the appended drawings, in which.

Figure 1:
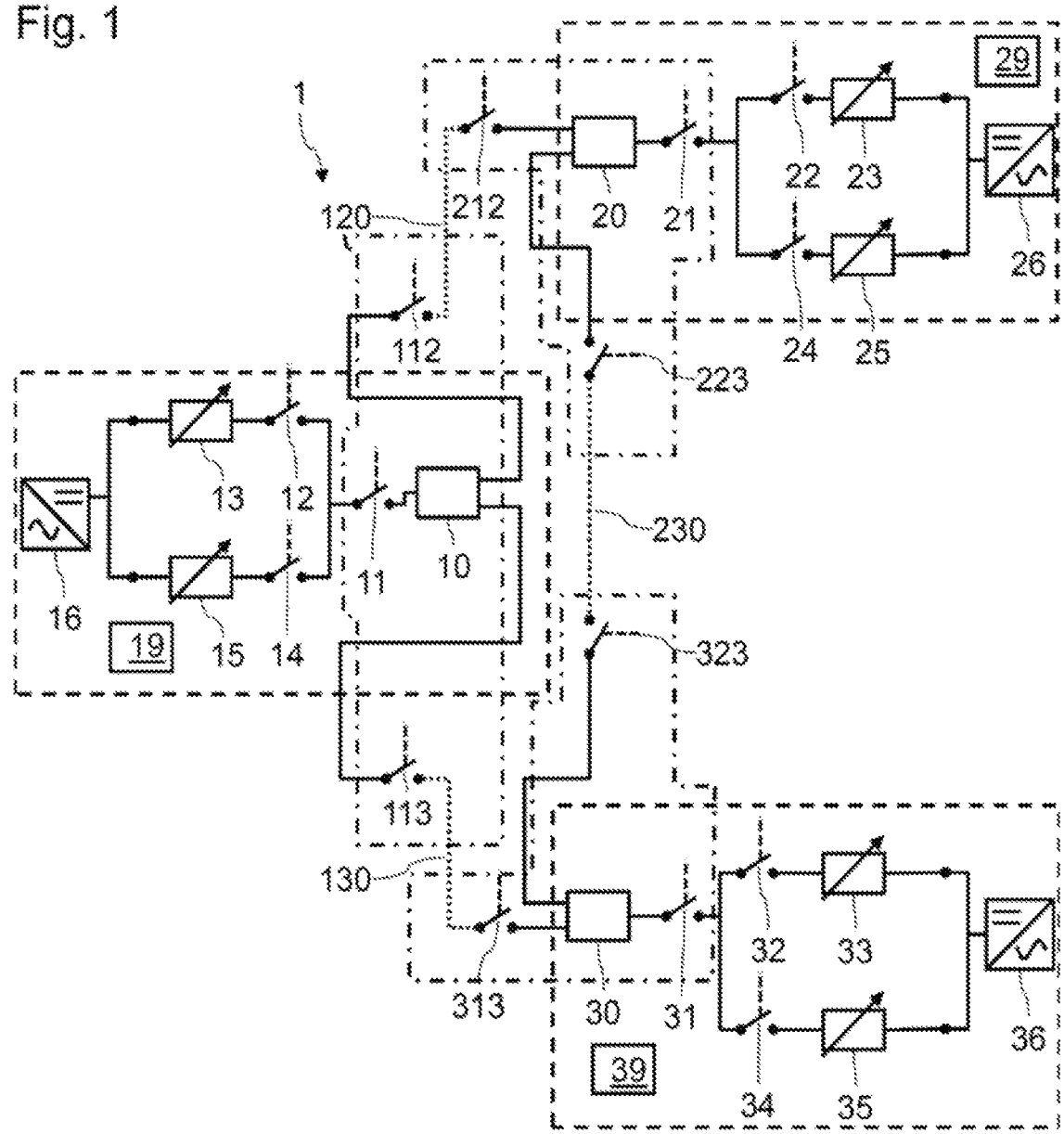
FIG. 1 is a simplified example of a high-voltage DC network for the implementation of the invention.

FIG. 1 is a simplified schematic representation of one example of a high-voltage DC network 1 comprising interconnection nodes 10, 20 and 30. The simplified network 1 illustrated here comprises high-voltage lines 120, 130 and 230. The network 1 here is illustrated in a simplified manner in a unipolar configuration. The line 120 is for connecting the interconnection nodes 10 and 20, the line 130 is for connecting the interconnection nodes 10 and 30, and the line 230 is for connecting the interconnection nodes 20 and 30. Each interconnection node comprises an interface for connection to high-voltage lines, and an interface for connection to a local network. Converters 16, 26 and 36 of the multi-level modular type or MMC (for Modular Multi-Level Converter) are connected to the respective local network connection interface of the interconnection nodes 10, 20 and 30. The converters 16, 26 and 36 are of the half-bridge type. The converters 16, 26 and 36 are associated with local AC networks or equipment (for example electrical generators such as wind farms, tidal power stations, nuclear power stations, thermal power stations or else photovoltaic generators, or local transport or consumer networks). The converters 16, 26 and 36 control, in a manner known per se, the flow of power between their AC interface and their DC interface.

The MMC converter 16 is connected to the local network interface of the interconnection node 10 via a protection circuit. This protection circuit comprises a switch 11 connected to the local network interface of the interconnection node 10. The protection circuit furthermore comprises a split circuit connected in series with the switch 11, between a DC input of the converter 16 and the local network interface of the interconnection node 10. The split circuit comprises first and second branches connected in parallel. The first branch comprises a switch 12 connected in series with a current limiter 13. The second branch comprises a switch 14 connected in series with a current limiter 15.

The switch 11 here is a circuit breaker of the mechanical type. The switch 11 is notably selected so as to provide a current interruption capability between the interconnection node 10 and the converter 16. The current limiter 13 and the current limiter 15 here are of the superconducting short-circuit current limiter or SCFCL type. The switches 12 and 14 here are fast-switching controlled isolators. The high-voltage line 120 is connected to the interconnection node 10 via a switch 112. The switch 112 here is a circuit breaker of the mechanical type. Although not shown, a fast-switching controlled isolator may be connected in series with the switch 112 between the high-voltage line 120 and the interconnection node 10. The high-voltage line 130 is connected to the interconnection node 10 via a switch 113. The switch 113 here is a circuit breaker of the mechanical type. Although not shown, a fast-switching controlled isolator may be connected in series with the switch 113 between the high-voltage line 130 and the interconnection node 10.

The MMC converter 26 is connected to the local network interface of the interconnection node 20 via a protection circuit. This protection circuit comprises a switch 21 connected to the local network interface of the interconnection node 20. The protection circuit furthermore comprises a split circuit connected in series with the switch 21, between a DC input of the converter 26 and the local network interface of the interconnection node 20. The split circuit comprises first and second branches connected in parallel. The first branch comprises a switch 22 connected in series with a current limiter 23. The second branch comprises a switch 24 connected in series with a current limiter 25.

The switch 21 here is a circuit breaker of the mechanical type. The switch 21 is notably selected so as to provide a current interruption capability between the interconnection node 20 and the converter 26. The current limiter 23 and the current limiter 25 here are of the superconducting short-circuit current limiter or SCFCL type. The switches 22 and 24 here are fast-switching controlled isolators. The high-voltage line 120 is connected to the interconnection node 20 via a switch 212. The switch 212 here is a circuit breaker of the mechanical type. Although not shown, a fast-switching controlled isolator may be connected in series with the switch 212 between the high-voltage line 120 and the interconnection node 20. The high-voltage line 230 is connected to the interconnection node 20 via a switch 223. The switch 223 here is a circuit breaker of the mechanical type. Although not shown, a fast-switching controlled isolator may be connected in series with the switch 223 between the high-voltage line 230 and the interconnection node 20.

The MMC converter 36 is connected to the local network interface of the interconnection node 30 via a protection circuit. This protection circuit comprises a switch 31, connected to the local network interface of the interconnection node 30. The protection circuit furthermore comprises a split circuit connected in series with the switch 31, between a DC input of the converter 36 and the local network interface of the interconnection node 30. The split circuit comprises first and second branches connected in parallel. The first branch comprises a switch 32 connected in series with a current limiter 33. The second branch comprises a switch 34 connected in series with a current limiter 35.

The switch 31 here is a circuit breaker of the mechanical type. The switch 31 is notably selected so as to provide a current interruption capability between the interconnection node 30 and the converter 36. The current limiter 33 and the current limiter 35 here are of the superconducting short-circuit current limiter or SCFCL type. The switches 32 and 34 here are fast-switching controlled isolators. The high-voltage line 130 is connected to the interconnection node 30 via a switch 323. The switch 323 here is a circuit breaker of the mechanical type. Although not shown, a fast-switching controlled isolator may be connected in series with the switch 323 between the high-voltage line 230 and the interconnection node 30. The high-voltage line 130 is connected to the interconnection node 30 via a switch 313. The switch 313 here is a circuit breaker of the mechanical type. Although not shown, a fast-switching controlled isolator may be connected in series with the switch 313 between the high-voltage line 130 and the interconnection node 30.

With current limiters 13, 15, 23, 25, 33 and 35 of the superconducting type, the latter have a potential difference of zero between their terminals when they are in the superconducting state, which therefore allows the losses induced in each branch, under normal operation of the network 1, to be limited.

The controlled switches 11, 112, 113, 21, 212, 223, 31, 313 and 323 are advantageously mechanical circuit breakers, notably owing to the low on-line losses that they are capable of generating.

The current limiters 15, 25 and 35 are dimensioned so as to maintain the short-circuit current flowing through them at a level lower than the current interruption capability of the switches 112 and 113, 212 and 223, 313 and 323, respectively. The current limiters 15, 25 and 35 thus guarantee the effective opening of the switches 112 and 113, 212 and 223, 313 and 323, respectively, in the case of occurrence of a short-circuit.

Similarly, the current limiters 13, 23 and 33 are dimensioned so as to maintain the short-circuit current flowing through them at a level lower than the current interruption capability of the switches 112 and 113, 212 and 223, 313 and 323, respectively. The current limiters 13, 23 and 33 thus guarantee the effective opening of the switches 112 and 113, 212 and 223, 313 and 323, respectively, in the case of occurrence of a short-circuit.

Communications networks are furthermore created between various pieces of equipment.

A communications network (illustrated with a dashed-dotted line) is created at the interconnection node 10 between the switches 11, 112 and 113. A communications network (illustrated with a dashed-dotted line) is created at the interconnection node 20 between the switches 21, 212 and 223. A communications network (illustrated with a dashed-dotted line) is created at an interconnection 30 between the switches 31, 313 and 323.

A communications network (illustrated with a dashed line) is created between the interconnection node 10, the switch 11, the switch 12, the switch 14, the limiters 13 and 15, and the converter 16. A communications network (illustrated with a dashed line) is created between the interconnection node 20, the switch 21, the switch 22, the switch 24, the limiters 23 and 25, and the converter 26. A communications network (illustrated with a dashed line) is created between the interconnection node 30, the switch 31, the switch 32, the switch 34, the limiters 33 and 35, and the converter 36.

A communications network is created between the switches 112 and 212. A communications network is created between the switches 223 and 323. A communications network is created between the switches 113 and 313.

In an initial configuration without any faults:
a local control circuit 19 maintains the switches 11, 14, 112 and 113 closed, and maintains the switch 12 open;
a local control circuit 29 maintains the switches 21, 24, 212 and 223 closed, and maintains the switch 22 open;
a local control circuit 39 maintains the switches 31, 34, 313 and 323 closed, and maintains the switch 32 open.

The operation of the protection of the network 1 will now be detailed in a situation where a short-circuit to earth occurs on the line 230 (or a short-circuit between core and screen of a cable for example) close to the switch 323. The short-circuit current propagates throughout the network. The protection will aim to implement the following steps:
identify the faulty high-voltage line;
isolate the fault;
re-establish the voltage level on the network;
re-establish the flow of power.

Figure 2:
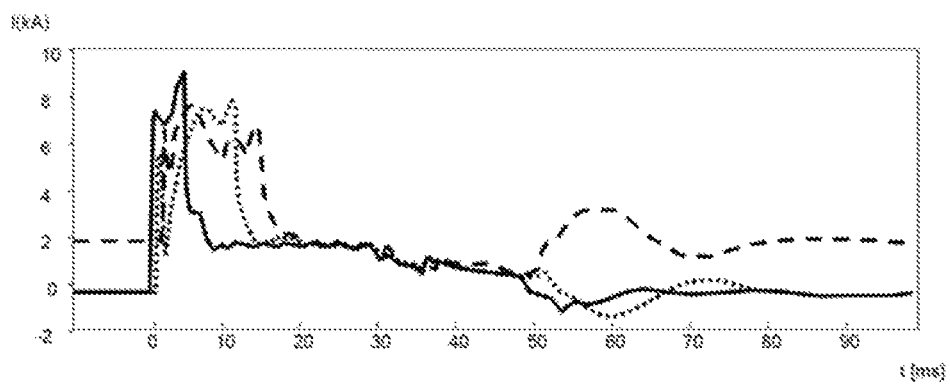
FIG. 2 is a simulation diagram of the currents flowing through various converters during a fault condition.
Figure 3:
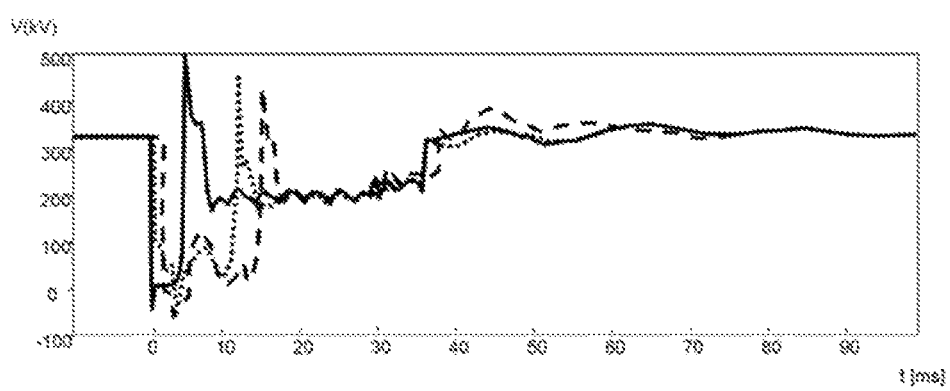
FIG. 3 is a simulation diagram of the voltages at the input of various converters during a fault condition.
Figure 5:
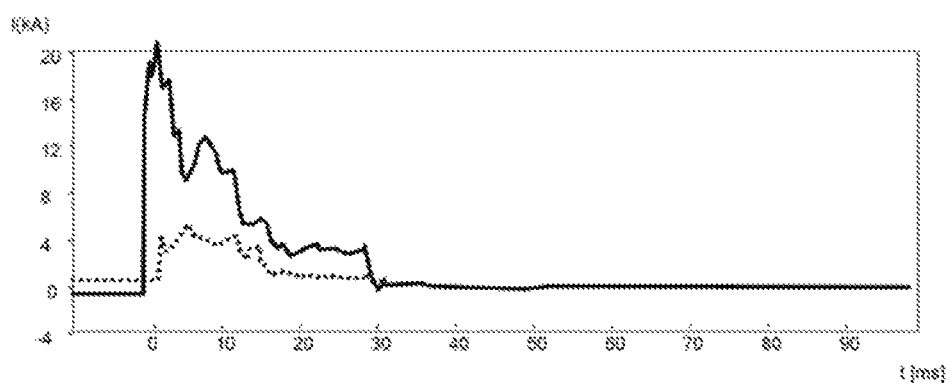
FIG. 5 is a simulation diagram of the currents flowing through switches at the ends of a line in a short-circuit condition.

The identification of the faulty line may be carried out as follows:
a fault is detected in a non-synchronous manner within each interconnection node 10, 20 and 30. The detection of the fault is carried out in a manner known per se within each interconnection node by local voltage and current measurements;
each converter 16, 26, 36 activates its internal protection. Since an MMC converter is not designed to withstand high short-circuit currents (an MMC converter is generally designed for a maximum current of 4 kA), the internal protection of each MMC converter 16, 26 and 36 is activated as soon as the current passing through it exceeds a threshold. Each activated MMC converter 16, 26 or 36 then no longer provides a voltage and power control;

for each activated MMC converter 16, 26 or 36 (with internal protection), the respective current limiter 15, 25 or 35 then has a fault current flowing through it. This current limiter is then activated. The closer an MMC converter is to the location of the short-circuit, the faster the current flowing through it will increase. The respective current limiters 15, 25 and 35 will thus be activated in a non-synchronous manner, as can be seen from the diagram in FIG. 2. The time t=0 corresponds to the occurrence of the fault short-circuit. The short-circuit current supplied by each MMC converter here falls below 2 kA once the corresponding current limiter has been activated. Owing to the current limitation, for each MMC converter 16, 26 or 36, a certain time is available for the identification of the faulty high-voltage line;

measurements of voltage and current in these switches 223 and 323 and the use of the communications network between the switches 223 and 323 allows a short-circuit on the line 230 to be identified, and its proximity to the switch 323 to be identified. This identification may be carried out in a manner known per se from the document "Protection system for meshed HVDC network using superconducting fault current limiters" notably published by Justine DESCLOUX and Camille GANDIOLI, within a time of less than 10 ms. FIG. 5 is a diagram of the currents through the switches 223 (dotted line) and 323 (continuous line) when the short-circuit occurs. It may be observed that these currents have relative amplitudes allowing both a short-circuit on the line 230 and the proximity of this short-circuit to the switch 323 to be identified for example, a control circuit of the node 30 receives the measurements coming from the switch 223 and from the switch 323 (at least the direction of the current flowing through these switches, advantageously the voltage and the current measured at these switches), so as to deduce from this that the line 230 is faulty and that this fault is close to the switch 323. Alternatively, an algorithm for local detection of a fault in the high-voltage line may be used, in order for a node connected to this high-voltage line to supply a command to open the controlled switch of the other node connected to this high-voltage line. Independently, a control circuit of the interconnection node 20 receives the measurements coming from the switch 223 and from the switch 323, or the command for the opening of the switch 223, so as to deduce from this that the line 230 is faulty and that this fault is close to the switch 323;

These steps for identification of the faulty line are carried out within the 10 ms following the occurrence of the short-circuit on the line 230, owing to a simple communication chain and to an identification capacity based on a reduced number of measurements.

Owing to the presence of the current limiters 15, 25 and 35 interposed between the converters 16, 26 and 36 and the high-voltage lines 120, 130 and 230, a current limitation is obtained for a time equal to at least 10 ms in order to allow the aforementioned steps for identification of the faulty line to be implemented.

Figure 4:
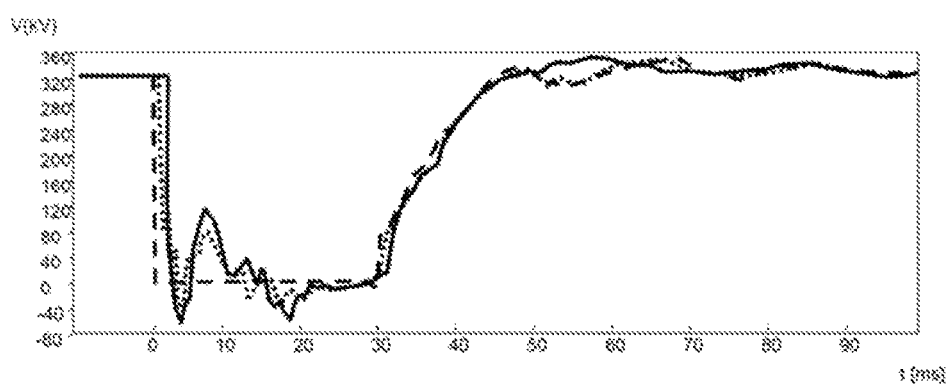
FIG. 4 is a simulation diagram of the voltages on interconnection nodes during a fault condition.

Shortly after the appearance of the short-circuit, the respective voltages on the local network interfaces of the interconnection nodes 10 (continuous line), 20 (dotted line) and 30 (dashed line) fall abruptly to become close to zero after 10 ms, as illustrated in FIG. 4.

After the step for identification of the faulty high-voltage line, the step for isolation of the fault may be implemented as follows:

a verification of the current interruption capabilities of the switches 112, 113, 212, 223, 313 and 323. In the example illustrated, the fault may begin to be isolated starting from t=12 ms after the appearance of the fault, if the switches (or mechanical circuit breakers) 112, 113, 212, 223, 313 and 323 have a current interruption capability of 8 kA. Alternatively, the current flowing through each switch 112, 113, 212, 223, 313 and 323 may also be measured and it may also be determined from which point this current measured for a switch is lower than the current interruption capability. The current interruption capability of the switches of the high-voltage lines of the network 1 is dimensioned in a manner known per se as a function of the size of the network 1 and of the number of stations that are connected to it. Knowing the number of MMC converters connected to the network, the maximum possible fault current in the case of a fault may be determined, since it is at the most equal to the sum of the limitation currents of the current limiters connected in a branch in series with a closed switch. For example, if the current limiters 13, 23, 33, 15, 25 and 35 each have a limitation current equal to twice the nominal current ln of a current limiter, with a number N of MMC converters, the maximum fault current ldm is defined by ldm=N*2*ln. More generally speaking, each of the switches 112, 113, 212, 223, 313 and 323 will have a current interruption capability PdC equal to at least $\Sigma_{i=1}^{N} Cl_i$, with $Cl_i$ the limitation current of a current limiter of the protection circuit of the MMC converter of index i.

the fault current is then eliminated by controlling the opening of the switches 223 and 323. Between the sending of the commands for opening the switches 223 and 323 and their effective opening (taking for example electromechanical delays associated with the interruption of the fault current into account), a delay of 17 ms is observed here. The opening of the switches 223 and 323 therefore takes place here at t=29 ms;

the voltage on the network 1 is then restored. At this stage, the internal protection of the MMC converters 16, 26 and 36 is activated. For MMC converters using three-phase rectifiers, these MMC converters can only recover their voltage and power control if the voltage on their DC input exceeds around 0.7 times the nominal voltage. The currents through the current limiters 15, 25 and 35 fall progressively. At t=37 ms, the respective voltages on the local network interfaces of the interconnection nodes 10, 20 and 30 reach 0.7 times the nominal voltage;

the MMC converters 16, 26 and 36 are respectively informed by the interconnection nodes 10, 20 and 30 that the respective voltages on their local network interfaces are reaching 0.7 times the nominal voltage. The MMC converters 16, 26 and 36 then recover their voltage control, so as to restore the voltage on the high-voltage lines 120 and 130 to the nominal value. The output voltage of the MMC converters 16, 26 and 36 also progressively recovers to the nominal level.

The current limiters 15, 25 and 35 are then again activated into the resistive state and traversed by nominal currents. These current limiters 15, 25 and 35 cannot return to the superconducting state without interrupting their conduction. By measuring the current in each MMC converter 16, 26 and 36, and by measuring the voltage on the local network interface of the interconnection nodes 10, 20 and 30, it may be determined within each protection circuit that the short-circuit fault has been isolated. At this point, the switches 12, 22 and 32 are closed. The currents from the MMC converters 16, 26 and 36 then respectively flow through the current limiters 13, 23 and 33 which are in the superconducting state. The currents from the MMC converters 16, 26 and 36 then no longer flow through the current limiters 15, 25 and 35.

When the switches 12, 22 and 32 are effectively closed, the output voltage of the MMC converters 16, 26 and 36 is equal to the voltage on the respective local network interface of the interconnection nodes 10, 20 and 30. The power control of the MMC converters 16, 26 and 36 may then be recovered. The flow of power through the high-voltage lines 120 and 130 may then also be restored.

After a safety time delay, the switches 14, 24 and 34 may be opened, so that the current limiters 15, 25 and 35 can progressively return to their superconducting state for a later use.

It is observed that the network 1 is now again functional with isolation of the fault after a period of 50 ms.

The use of fast switches in series in a branch with each of the current limiters notably allows a nominal current to be re-established for the MMC converters 16, 26 and 36 in a reduced time.

Advantageously, the current limiters 13 and 15, 23 and 25, or 33 and 35 may use the same cooling tank, with a view to limiting their cost.

The invention claimed is:

1. A method of protecting a high-voltage DC electrical network (1), the network comprising:
high-voltage electrical lines (120,130, 230);
three interconnection nodes (10, 20, 30) each comprising:
a common network interface comprising at least two controlled switches and exhibiting respective current interruption capabilities, the common network interface being connected to other interconnection nodes via two high-voltage lines connected to its two respective controlled switches, such that each high-voltage line is connected between two controlled switches at its ends;
a local network interface;
three local networks, connected to a local network interface of a respective interconnection node (10, 20, 30), each local network comprising:
an MMC converter (16, 26, 36);
a protection circuit connected between this MMC converter and the local network interface of its interconnection node, the protection circuit comprising first and second branches connected in parallel, the first branch including a first controlled switch (14) and a first short-circuit current limiter (15), the second branch including a second controlled switch (12) and a second short-circuit current limiter (13);
the method comprising the steps for:
initially maintaining the said first controlled switches (14) closed and the said second controlled switches (12) open;
measuring the voltage on and the current in each of the said controlled switches of the common network interface;
for each of the said controlled switches connected to one end of a high-voltage line, communicating at least the direction of the current flowing through this controlled switch, or a command to open the controlled switch situated at the other end of the high-voltage line, to the interconnection node comprising the controlled switch connected to the other end of this high-voltage line;
each interconnection node connected to a faulty high-voltage line:
identifies a fault on this high-voltage line on the basis of the current and of the voltage measured for its controlled switch connected to this faulty high-voltage line and on the basis of the direction of the current communicated for the controlled switch connected to the other end of this faulty high-voltage line, or on the basis of a command to open its controlled switch, and
verifies that the current flowing through its controlled switch connected to this faulty high-voltage line is lower than the current interruption capability of this controlled switch and controls the opening of this controlled switch; then
for each of the MMC converters (16, 26, 36), it is verified that the voltage measured on a controlled switch of its common network interface has exceeded a verification threshold, then the second controlled switch of its protection circuit is closed.

2. The method of protecting a high-voltage DC electrical network (1) as claimed in claim 1, in which the said first and second short-circuit current limiters (13, 15, 23, 25, 33, 35) are of the superconducting type, the method furthermore comprising the opening of the said first controlled switches (14, 24, 34) after the closing of the said second controlled switches (12, 22, 32).

3. The method of protecting a high-voltage DC electrical network as claimed in claim 1, in which the said controlled switches of the common network interfaces of the protected electrical network each exhibit a current interruption capability PdC at least equal to $\Sigma_{i=1}^{N} Cl_i$, with N the number of MMC converters, and $Cl_i$ the limitation current of the first current limiter of the protection circuit of the MMC converter of index i.

4. The method of protecting a high-voltage DC electrical network (1) as claimed in claim 1, in which the controlled switches of the common network interfaces of the electrical network are mechanical circuit breakers.

5. The method of protecting a high-voltage DC electrical network as claimed in claim 1, in which the said verification voltage threshold for each MMC converter is equal to at least 70% of its nominal voltage.

6. The method of protecting a high-voltage DC electrical network as claimed in claim 1, in which the said MMC converters are of the half-bridge type.

7. The method of protecting a high-voltage DC electrical network as claimed in claim 1, comprising the following steps:
for each of the said controlled switches connected to one end of a high-voltage line, communicating its measured voltage and current to the interconnection node comprising the controlled switch connected to the other end of this high-voltage line;
identifying a fault on this high-voltage line on the basis of the current and of the voltage measured for its controlled switch connected to this faulty high-voltage line and on the basis of the current and of the voltage communicated for the controlled switch connected to the other end of this faulty high-voltage line.

8. A high-voltage DC electrical network (1), characterized in that it comprises:

high-voltage electrical lines (120, 130, 230);

three interconnection nodes (10, 20, 30) each comprising:
a common network interface comprising at least two controlled switches and exhibiting respective current interruption capabilities, the common network interface being connected to other interconnection nodes via two high-voltage lines connected to its two respective controlled switches, such that each high-voltage line is connected between two controlled switches at its ends;
a local network interface;

three local networks, connected to a local network interface of a respective interconnection node (10, 20, 30), each local network comprising:
an MMC converter (16, 26, 36);
a protection circuit connected between this MMC converter and the local network interface of its interconnection node, the protection circuit comprising first and second branches connected in parallel, the first branch including a first controlled switch (14) and a first short-circuit current limiter (15), the second branch including a second controlled switch (12) and a second short-circuit current limiter (13);
a control and monitoring circuit configured for:
initially maintaining the said first controlled switches closed and the said second controlled switches open;
measuring the voltage on and the current in each of the said controlled switches of the common network interface;
for each of the said controlled switches connected to one end of a high-voltage line, communicating at least the direction of the current flowing through this controlled switch, or a command to open the controlled switch situated at the other end of the high-voltage line, to the interconnection node comprising the controlled switch connected to the other end of this high-voltage line;
identifying a fault on this high-voltage line on the basis of the current and of the voltage measured for its controlled switch connected to this faulty high-voltage line and on the basis of the direction of the current communicated for the controlled switch connected to the other end of this faulty high-voltage line, or on the basis of a command to open its controlled switch, and
verifying that the current flowing through its controlled switch connected to this faulty high-voltage line is lower than the current interruption capability of this controlled switch and controlling the opening of this controlled switch; then
for each of the MMC converters (16, 26, 36), verifying that its voltage has exceeded a threshold and closing the second controlled switch of its protection circuit.

9. The high-voltage DC electrical network (1) as claimed in claim 8, in which the said first and second short-circuit current limiters (13, 15, 23, 25, 33, 35) are of the superconducting type, the said control and monitoring circuit being configured for opening the said first controlled switches (14, 24, 34) after the closing of the said second controlled switches (12, 22, 32).

10. The high-voltage DC electrical network (1) as claimed in claim 8, in which the said controlled switches of the common network interfaces of the protected electrical network each exhibit a current interruption capability PdC equal to at least $\Sigma_{i=1}^{N} Cl_i$, with N the number of MMC converters, and $Cl_i$ the limitation current of the first current limiter of the protection circuit of the MMC converter of index i.

11. The high-voltage DC electrical network (1) as claimed in claim 8, in which the controlled switches of the common network interfaces of the electrical network are mechanical circuit breakers.

12. The high-voltage DC electrical network (1) as claimed in claim 8, in which the said verification voltage threshold of each MMC converter is equal to at least 70% of its nominal voltage.

13. The high-voltage DC electrical network (1) according to claim 8, in which the said MMC converters are of the half-bridge type.

* * * * *